US009580299B2

(12) United States Patent
Dehe et al.

(10) Patent No.: US 9,580,299 B2
(45) Date of Patent: Feb. 28, 2017

(54) MEMS DEVICE AND METHOD OF MAKING A MEMS DEVICE

(71) Applicant: Infineon Technologies AG, Neubiberg (DE)

(72) Inventors: Alfons Dehe, Reutlingen (DE); Martin Wurzer, Munich (DE); Christian Herzum, Starnberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/971,879

(22) Filed: Dec. 16, 2015

(65) Prior Publication Data

US 2016/0096726 A1  Apr. 7, 2016

Related U.S. Application Data

(62) Division of application No. 13/439,729, filed on Apr. 4, 2012, now Pat. No. 9,409,763.

(51) Int. Cl.
*H04R 19/04* (2006.01)
*B81B 3/00* (2006.01)
*H04R 19/00* (2006.01)
*B81C 1/00* (2006.01)
*H04R 7/06* (2006.01)

(52) U.S. Cl.
CPC .......... *B81B 3/007* (2013.01); *B81B 3/0018* (2013.01); *B81B 3/0035* (2013.01); *B81B 3/0051* (2013.01); *B81C 1/00158* (2013.01); *H04R 19/005* (2013.01); *B81B 2201/0257* (2013.01); *H04R 7/06* (2013.01); *H04R 19/04* (2013.01)

(58) Field of Classification Search
CPC .......... H04R 19/005; H04R 19/04; B81B 2201/0257; B81B 3/007
See application file for complete search history.

(56) References Cited

U.S. PATENT DOCUMENTS 5,677,965 A * 10/1997 Moret ................. H04R 19/005
381/113
5,870,482 A   2/1999 Loeppert et al.
6,168,906 B1  1/2001 Bernstein et al.
6,441,451 B1  8/2002 Ikeda et al.
(Continued)

FOREIGN PATENT DOCUMENTS

CN       1260796 C    6/2006
CN     101426718 A    5/2009
(Continued)

OTHER PUBLICATIONS

Kaiser, T et al., "Silicon Nitride Biaxial Pointing Mirrors with Stiffening Ribs," MOEMS and Miniaturized Systems II, 276 Proceedings of SPIE vol. 4561, Oct. 2, 2001, 8 pages.
(Continued)

*Primary Examiner* — Evan Pert
(74) *Attorney, Agent, or Firm* — Slater Matsil, LLP

(57) ABSTRACT

A MEMS device and a method of making a MEMS device are disclosed. In one embodiment a semiconductor device comprises a substrate, a moveable electrode and a counter electrode, wherein the moveable electrode and the counter electrode are mechanically connected to the substrate. The movable electrode is configured to stiffen an inner region of the movable membrane.

20 Claims, 17 Drawing Sheets

(56) References Cited

U.S. PATENT DOCUMENTS

| | | | |
|---|---|---|---|
| 6,756,248 B2 | 6/2004 | Ikeda et al. | |
| 7,153,717 B2 | 12/2006 | Carley et al. | |
| 7,253,016 B2 * | 8/2007 | Barzen | H04R 19/005 257/415 |
| 7,502,482 B2 * | 3/2009 | Dehe | B81B 3/001 381/175 |
| 7,826,629 B2 * | 11/2010 | Miles | H04R 23/006 250/237 G |
| 8,072,010 B2 | 12/2011 | Lutz | |
| 8,103,027 B2 | 1/2012 | Zhang et al. | |
| 8,104,354 B2 | 1/2012 | Hsu et al. | |
| 8,121,315 B2 | 2/2012 | Song et al. | |
| 8,126,167 B2 | 2/2012 | Hirade et al. | |
| 8,345,895 B2 | 1/2013 | Chen | |
| 8,553,911 B2 | 10/2013 | Chen | |
| 8,588,435 B2 * | 11/2013 | Bominaar-Silkens | H04R 3/002 381/150 |
| 8,901,682 B2 * | 12/2014 | Reimann | H04R 19/005 257/416 |
| 9,066,180 B2 * | 6/2015 | Zoellin | H04R 19/005 |
| 9,327,961 B2 * | 5/2016 | Lemarquand | B81B 3/007 |
| 9,409,763 B2 * | 8/2016 | Dehe | H04R 19/005 |
| 2001/0038148 A1 | 11/2001 | Mastromatteo et al. | |
| 2004/0106294 A1 | 6/2004 | Lee et al. | |
| 2005/0078349 A1 | 4/2005 | Patel et al. | |
| 2005/0139542 A1 * | 6/2005 | Dickensheets | B81B 3/007 210/490 |
| 2005/0241944 A1 | 11/2005 | Dehe et al. | |
| 2008/0104825 A1 | 5/2008 | Dehe et al. | |
| 2010/0167497 A1 | 7/2010 | Fang et al. | |
| 2012/0319217 A1 | 12/2012 | Dehe et al. | |
| 2013/0264663 A1 * | 10/2013 | Dehe | H04R 19/005 257/416 |
| 2014/0016798 A1 | 1/2014 | Laming et al. | |

FOREIGN PATENT DOCUMENTS

| | | |
|---|---|---|
| DE | 4227819 A1 | 2/1993 |
| DE | 102005042664 A1 | 3/2007 |
| DE | 102009026629 A1 | 12/2010 |
| DE | 69934841 T2 | 10/2011 |
| JP | 6418763 U | 1/1989 |
| JP | 2002076269 A | 3/2002 |
| JP | 2002328117 A | 11/2002 |
| WO | 03036737 A2 | 5/2003 |
| WO | 2009021343 A1 | 2/2009 |

OTHER PUBLICATIONS

Zou, Q, et al., "Design and Fabrication of Silicon Condenser Microphone Using Corrugated Diaphragm Technique", Journal of Microelectromechanical Systems, vol. 5, No. 3, Sep. 1996, pp. 197-204, IEEE.

* cited by examiner

MEMS DEVICE AND METHOD OF MAKING A MEMS DEVICE

This is a divisional application of U.S. application Ser. No. 13/439,729, entitled "MEMS Device and Method of Making a MEMS Device" which was filed on Apr. 4, 2012 and is incorporated herein by reference.

TECHNICAL FIELD

The present invention relates generally to MEMS devices and a method of making a MEMS device.

BACKGROUND

A MEMS (MicroElectrical-Mechanical System) microphone comprises a pressure-sensitive diaphragm disposed in a silicon chip. The MEMS microphone is sometimes integrated with a preamplifier into a single chip. MEMS microphones may also include an analog-to-digital converter (ADC) circuit making it a digital MEMS microphone.

SUMMARY OF THE INVENTION

In accordance with an embodiment of the present invention, a semiconductor device comprises a substrate, a moveable electrode and a counter electrode, wherein the moveable electrode and the counter electrode are mechanically connected to the substrate. The movable electrode is configured to stiffen an inner region of the movable membrane.

In accordance with an embodiment of the present invention, a MEMS structure comprises a substrate, a moveable electrode and a first perforated counter electrode, wherein the movable electrode and the first perforated counter electrode are mechanically connected to the substrate. The movable electrode comprises radial corrugation lines in an inner region and circular corrugation lines in an outer region. The first perforated counter electrode comprises first ridges.

In accordance with an embodiment of the present invention, a method of making an electrode of a MEMS device comprises forming radial openings in a mask layer, the mask layer disposed over a first sacrificial layer, the radial openings exposing surface portions of the first sacrificial layer, the radial openings leading away from a central point of the first sacrificial layer, forming isolation regions at the exposed surface portions, and forming a second sacrificial layer over the first sacrificial layer. The method further comprises forming a conductive layer over the second sacrificial layer, removing a first portion of the first sacrificial layer forming a first spacer; and removing a second portion of the second sacrificial layer forming a second spacer.

In accordance with an embodiment of the present invention, a method of making an electrode of a MEMS device comprises forming trenches in a first sacrificial layer, each trench has substantially the same depth, forming a second sacrificial layer lining a top surface of the first sacrificial layer, sidewalls and a bottom surface of the trenches and forming a conductive material layer over a top surface of the first sacrificial layer and filling the trenches. The method further comprises removing a first portion of the first sacrificial layer forming a first spacer; and removing a second portion of the second sacrificial layer forming a second spacer thereby exposing the conductive material layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely sensors or microphones. The invention may also be applied, however, to other MEMS structures such as RF MEMS, accelerometers and actuators.

Figure 1:
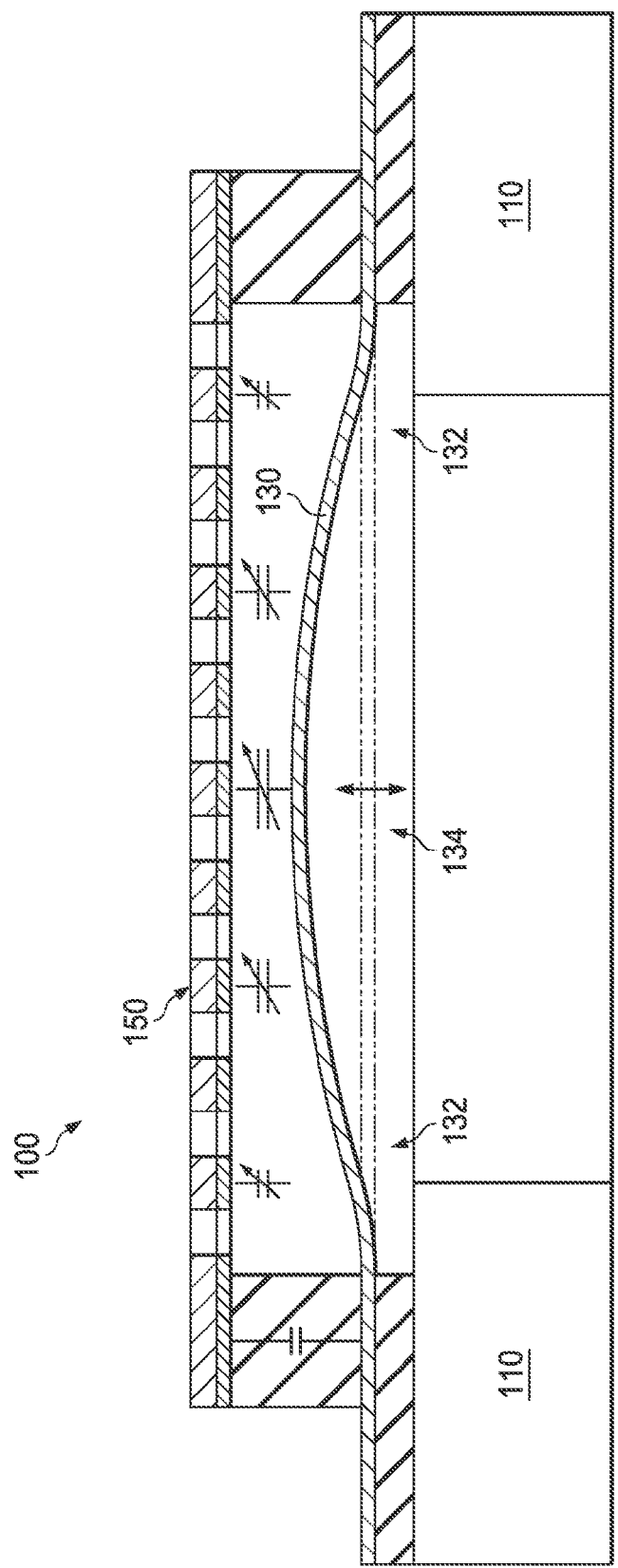
FIG. 1 shows a cross-sectional view of a conventional MEMS device.

FIG. 1 shows a conventional MEMS device. The distance between the membrane 130 and the backplate 150 and therefore the mechanical sensitivity is given by mechanical constraints and cannot be changed after the fabrication process of the MEMS structure is finalized. The membrane 130 and the backplate 150 form a static capacitance along the support structure (overlap of the membrane 130 and backplate 150 along the spacers). To decrease the static capacitance, the membrane 130 and the backplate 150 may only partially overlap. Since the membrane 130 bends uniformly across a cross-section, different segments of the membrane 130 provide different capacitance change contributions (different sizes of capacitances in FIG. 1) to the total capacitance change to be measured.

A problem with conventional microphones is that the segment with the largest capacitance change contribution (largest sensitivity contribution amount) is relatively small while the segment with the smallest capacitance change contribution (smallest sensitivity contribution amount) is relatively large.

Therefore, a MEMS structure is needed in the art in which the segment with the largest capacitance change contribution is large and the segments with the lower capacitance change contributions is small.

An embodiment of the invention provides a movable electrode comprising a stiff inner region and a flexible outer region. An embodiment of the invention provides a movable electrode with at least one corrugation line configured to provide stiffness in the inner region of the movable electrode. A further embodiment of the invention provides a movable electrode with at least one corrugation line configured to provide flexibility in the outer region of the movable electrode. In one embodiment the movable electrode comprises radial corrugation lines in an inner region and a circumferential corrugation line in an outer region.

An embodiment of the invention provides an inner region of a movable electrode which is substantially parallel to the counter electrode when deflected. A further embodiment provides a piston type movement of a membrane in a MEMS device.

An advantage is that the corrugation lines in the inner region stiffen the movable electrode against bending while the corrugation lines in the outer region make the movable electrode flexible. A further advantage of such an arrangement is that the stiff inner region is large relative to the flexible outer region. The stiff inner region provides a large capacitance change component.

A further advantage is that the radial corrugation lines and the circumferential corrugation lines of the movable electrode can be formed in a single process. A yet another advantage is that the capacitive change/sensitivity of the MEMS device can be increased.

Figure 2:
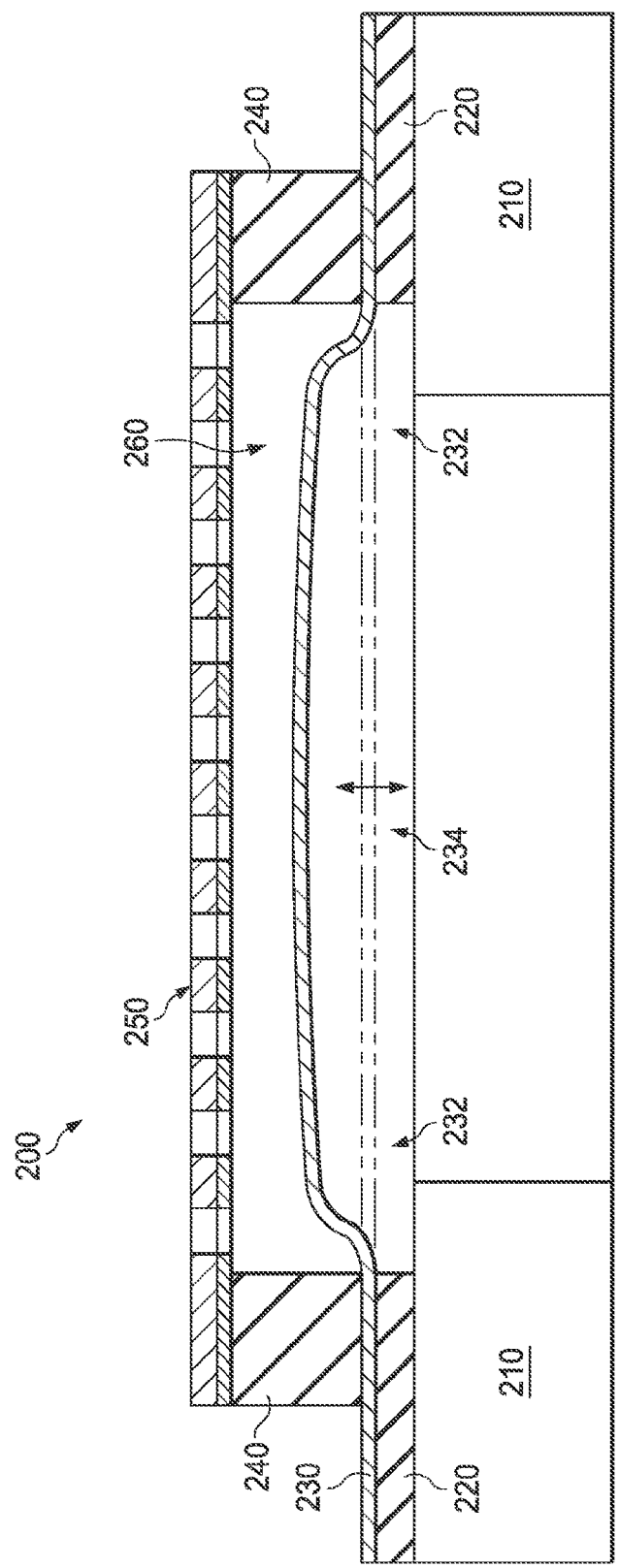
FIG. 2 shows a cross-sectional view of an embodiment of a MEMS device.

FIG. 2 shows a cross sectional view of a MEMS structure or device 200. The MEMS device 200 comprises a diaphragm, membrane or moveable electrode 230, a backplate or counter electrode 250 and an air gap 260 between the membrane 230 and the backplate 260. The membrane or movable electrode 230 is configured to move or deflect relative to the backplate or fixed counter electrode 260. This deflection results in a capacitance change between the membrane 230 and the backplate 260 which can be measured.

The membrane 230 and the backplate 260 are mechanically connected to a substrate 210 along their circumference. The membrane 230 is connected to the substrate via a first spacer 220. Alternatively, the membrane 230 may be arranged in the main plane of the substrate 210 without a first spacer 220. A second spacer 240 is arranged between the membrane 230 and the backplate 260 along their circumference. The membrane 230 and the backplate 260 may be circular or square. Alternatively, the membrane 230 and the backplate 260 may comprise any geometrical suitable form. A back volume may be arranged between the MEMS structure 200 and a board substrate wherein the board substrate may comprise a printed circuit board (PCB).

The substrate 210 may include a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In various embodiments, the substrate 210 may include blanket epitaxial layers. The substrate 210 may be a silicon wafer, a germanium wafer, or a compound semiconductor substrate including indium antimonide, indium arsenide, indium phosphide, gallium nitride, gallium arsenide, gallium antimonide, lead telluride, silicon germanium, silicon carbide or combinations thereof or even glass.

The semiconductor substrate 210 may include active components such as transistors, diodes, capacitors, amplifiers, filters or other electrical devices, or an integrated circuit (IC). The MEMS structure 200 may be a stand-alone device or may be integrated with an IC into a single chip.

The first spacer 220 and the second spacer 240 may comprise a dielectric or insulating material such a silicon dioxide, silicon nitride, a high-k dielectric such as silicon-oxynitide or combinations thereof.

The membrane 230 and the backplate 260 may comprise a conductive material such as polysilicon, doped polysilicon, a metal, or combinations thereof or combinations with dielectric layers such as silicon nitride, silicon oxynitride, oxide or polymeric layers. The backplate 260 may be perforated to reduce damping effects.

Embodiments of the invention provide a membrane 230 which is more flexible in an outer region 232 and stiffer in an inner region 234. The membrane 230 may comprise corrugation lines in the inner region 234 and/or corrugation lines in the outer region 232. For example, the membrane 230 comprises radial corrugation lines in the inner region 234 and circumferential corrugation lines in the outer region 232. The inner corrugation lines make the membrane 230 stiffer in the inner region 234 while the outer corrugation lines make the membrane 230 more flexible in the outer region 232.

Figure 3A:
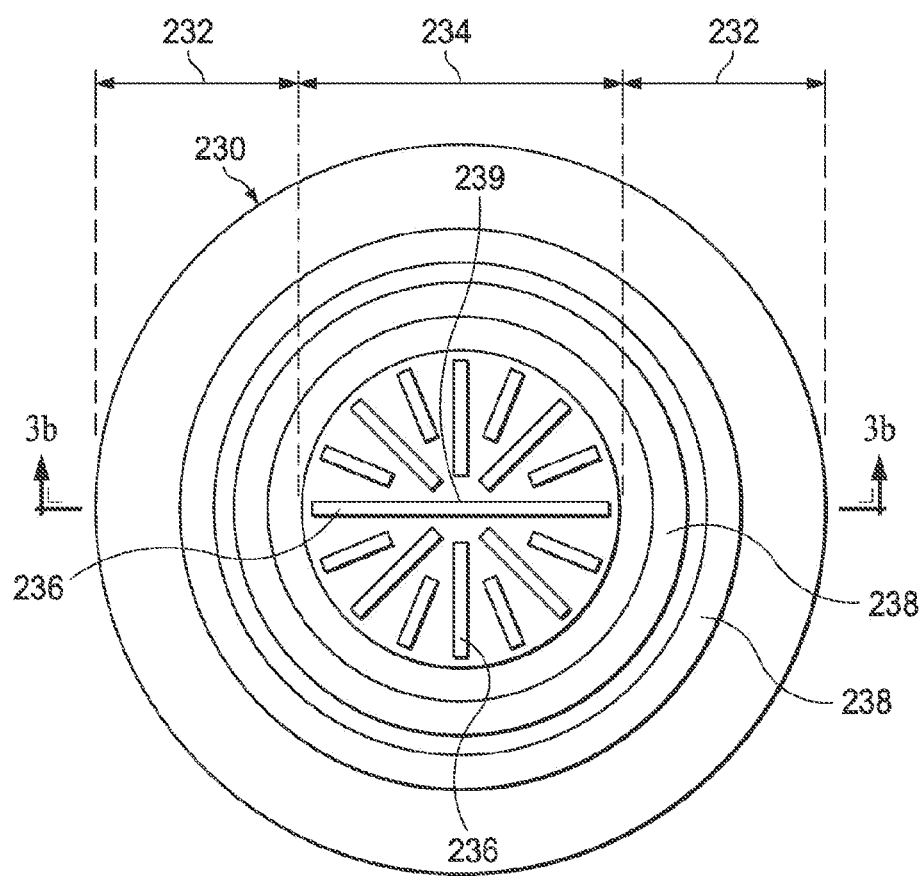
FIG. 3a shows a top view of an embodiment of a membrane.

Referring now to FIG. 3a which shows a top view of an embodiment of the circular membrane 230. The corrugation lines may have a top or a bottom in a different horizontal plane than a main surface of the membrane 230. The corrugation lines 236, 238 may be groove lines, indention lines, channels or recess lines. The corrugation lines 236 may be a single corrugation line.

The membrane 230 may comprise an inner single corrugation line 236 or a plurality of inner corrugation lines 236. The inner corrugation lines 236 may be radial corrugation lines. The plurality of inner corrugation lines 236 may comprise a star like configuration in one example. Alternatively, the plurality of inner corrugation lines 236 may have any configuration.

The membrane 230 may further comprise an outer corrugation line or a plurality of outer corrugation lines 238 in an outer region 232. The outer corrugation lines 238 in the outer region 232 may be circumferential to the inner region 234. For example, the outer corrugation lines may be polygonal, rectangular or circular. The outer corrugation lines 238 may comprise the same material and the same width but different length than the inner corrugation lines 236. The inner region 234 may comprise an area of about 80% of a radial distance from the center point 239 of the membrane 230 to an edge of the membrane 230 and the outer region 232 may comprise an area of about 20% of the radial distance from the center point 239 of the membrane 230 to the edge of the membrane 230.

Figure 3B:
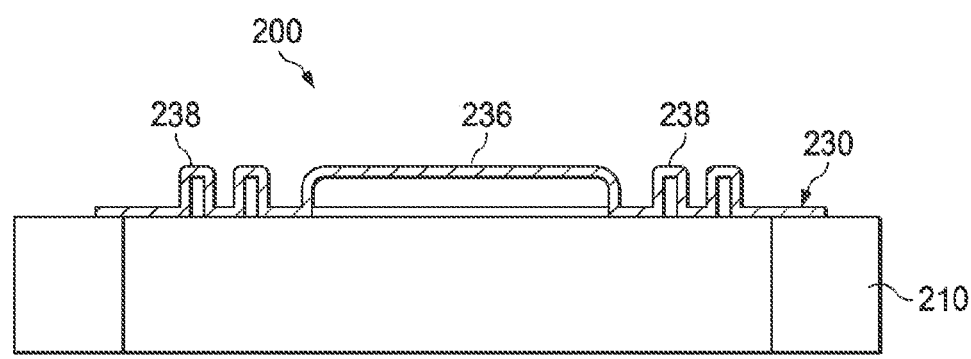
FIG. 3b shows a cross-sectional view of the membrane.

FIG. 3b shows a cross sectional view of the membrane along the line A-A. The corrugation lines 236, 238 serve different purposes. The inner corrugation lines 236 are configured to make the membrane 230 stiff while the outer corrugation lines 238 are configured to make the membrane 230 flexible. In one embodiment, the inner corrugation lines 236 are arranged different direction than the outer corrugation lines 238. For example, the inner corrugation lines 236 comprise a substantially orthogonal direction to the outer corrugation lines 238.

Figure 3C:
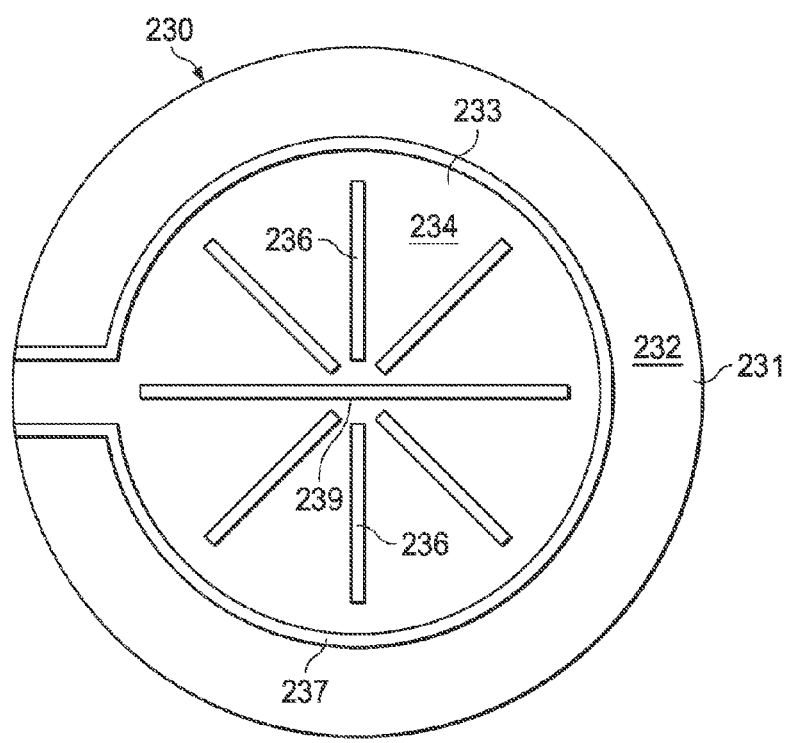
FIG. 3c shows a top view of an embodiment of a membrane having a first and a second electrode.

FIG. 3c shows a top view of another embodiment of the membrane 230. The membrane 230 may comprise a plurality of electrodes. For example, the membrane 230 comprises a first electrode 231 and a second electrode 233 which are electrically isolated from each other via an isolation region 237. The inner region 234 of the membrane 230 may comprise the second electrode 233 and the outer region 232 of the membrane 230 may comprise the first electrode 231. The inner region 234 comprising the second electrode 233 may be stiffened by corrugation lines 236.

Figure 4A:
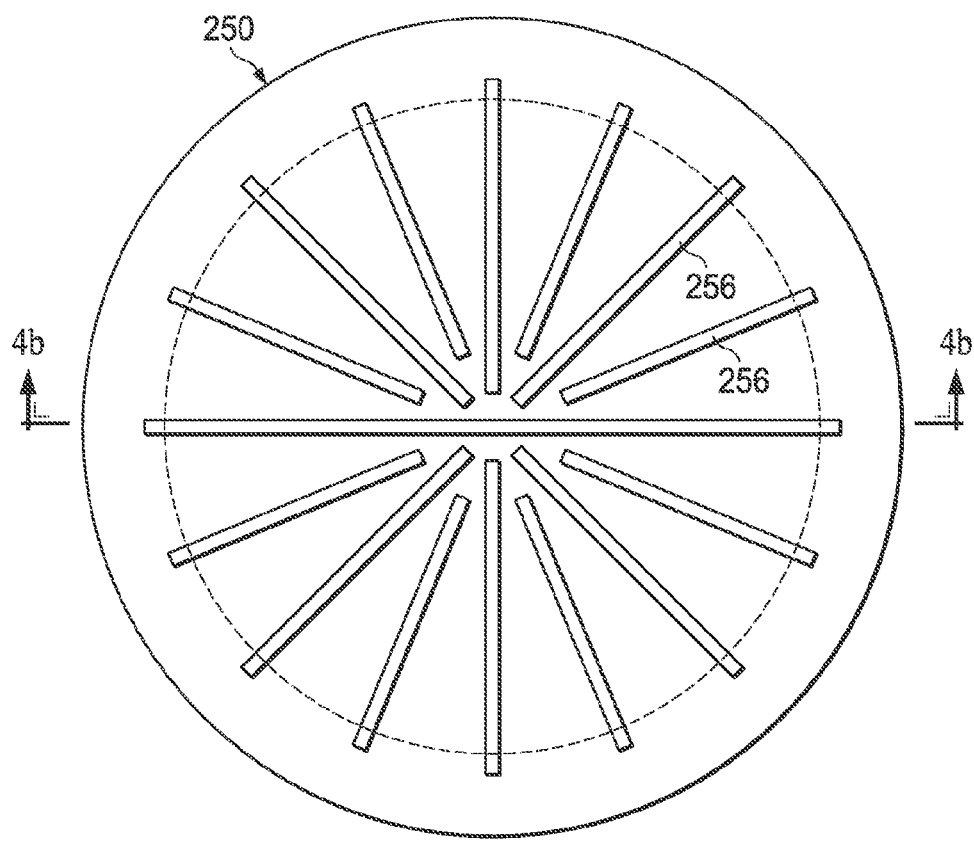
FIG. 4a shows a top view of an embodiment of a backplate.

FIG. 4a shows a top view of an embodiment of a circular backplate 250. Alternatively the backplate 250 may comprise a rectangular backplate or a backplate having any other suitable geometrical form. The backplate 250 may comprise a single corrugation line or a plurality of corrugation lines 256. The corrugation lines 256 may have a top or a bottom in a different horizontal plane than a main surface of the backplate 250. The corrugation lines 256 may be grooves, indention lines, channels or recess lines. The corrugation lines 256 may be a single corrugation line. Alternatively, the corrugation lines 256 may be ridges or fins.

The backplate 20 may comprise a single radial corrugation line or a plurality of radial corrugation lines 256. The corrugation lines 256 may comprise a radial configuration or a parallel configuration. For example, the plurality of radial corrugation lines may comprise a star like configuration. The corrugation lines 256 may be connected to each other. For example, the two adjacent corrugation lines 256 may be connected via a cross corrugation line 256. In one embodiment the corrugation lines 256 form a honeycomb configuration.

Figure 4B:
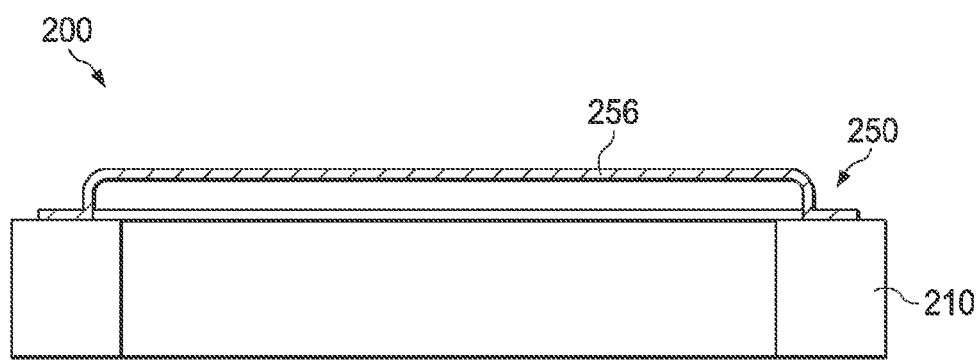
FIG. 4b shows a cross-sectional view of the backplate.

FIG. 4b shows a cross sectional view of the backplate along the line B-B. The backplate 250 is arranged that the corrugation lines 256 face away from the substrate 210. Alternatively, the backplate 250 is arranged so that the corrugation lines 256 face toward the substrate 210. Depending on the embodiment, a membrane 230 (not shown) may be arranged between the substrate 210 and the backplate 250 or the backplate 250 may be arranged between the membrane and the substrate 210.

Figure 4C:
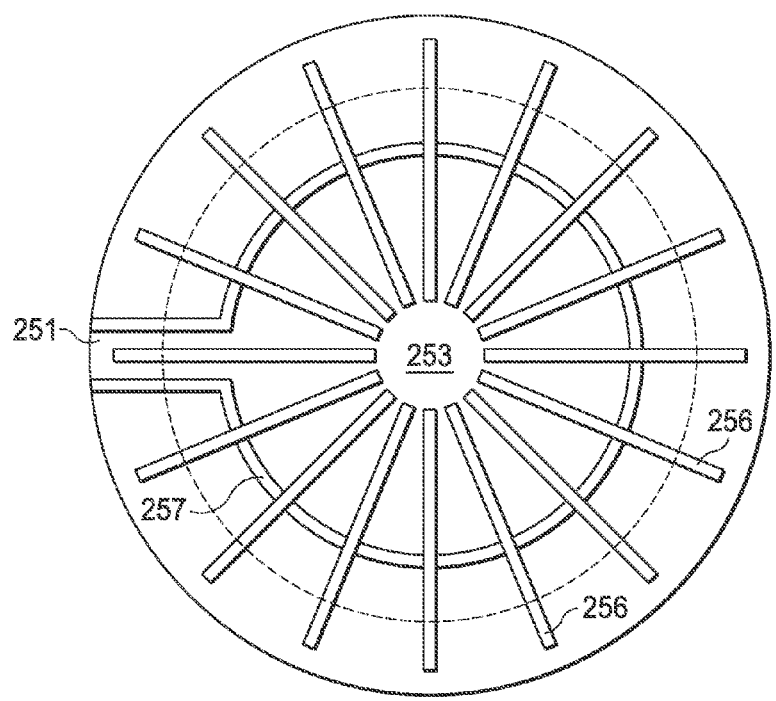
FIG. 4c shows a top view of an embodiment of a backplate having a first and a second electrode.

FIG. 4c shows a top view of an embodiment of the backplate 250. The backplate 250 may comprise a plurality of electrodes. For example, the backplate 250 comprises a first electrode 251 and a second electrode 253 which are electrically isolated from each other by an isolation region 257. The first electrode 251 may comprise the corrugation lines and/or the second electrode 253 may comprise the corrugation lines.

The plurality of electrodes of the membrane 230 and the plurality of electrodes of the backplate 250 may be aligned and vis-à-vis with each other. For example, the first electrode 231 of the membrane 230 and the first electrode 251 of the backplate 250 are substantially aligned and the second electrode 232 of the membrane 230 and the second electrode 252 of the backplate 250 are substantially aligned.

FIG. 5a-5g show an embodiment of making smooth corrugation lines in a membrane or moveable electrode. The smooth corrugation lines are formed by forming elongated isolation regions 520 in a first sacrificial layer 500. The elongated isolation regions 520 may have any pattern. For example, the elongated isolation regions 520 may extend radial away from a center point 539 of the membrane in an inner region. Moreover, the elongated isolation regions 520 may be circumferential in an outer region of the membrane.

Figure 5A:
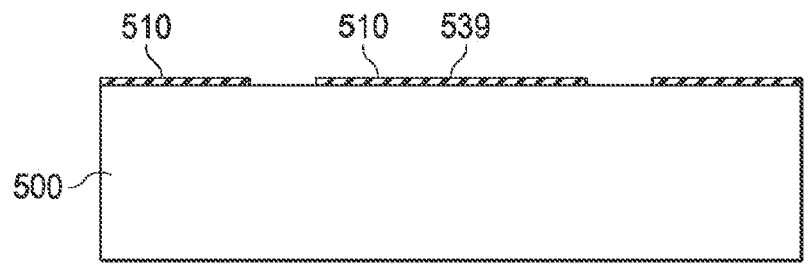
FIGS. 5a-5g show an embodiment of a method of manufacturing smooth groove lines in a membrane.

FIG. 5a illustrates a masking layer 510 formed over a first sacrificial layer 500. The first sacrificial layer 500 may be a substrate as described with respect to FIG. 2 or an isolation material such as an oxide or a nitride. The masking layer 510 comprises an insulating layer in various embodiments. The masking layer 510 may be a nitride such as a silicon nitride, an oxide such as a silicon oxide, or combinations thereof. The masking layer 510 may be formed by thermal oxidation or nitridation, or by using vapor deposition processes such as chemical vapor deposition, or plasma vapor deposition. The masking layer 510 may have different etch properties than the first sacrificial layer 500.

In an alternative embodiment, the masking layer 510 comprises a pad oxide layer, a polysilicon layer or an amorphous silicon layer over the pad oxide layer, and a silicon nitride layer over the polysilicon layer.

The masking layer 510 is patterned for forming regions of local isolation regions, which as described further below form patterns for the corrugation lines of the membrane 530. The masking layer 510 is patterned, e.g., by depositing a layer of photosensitive material (not shown) such as a photo resist over the masking layer 510. The local isolation regions may be oxide regions or nitride regions.

Figure 5B:
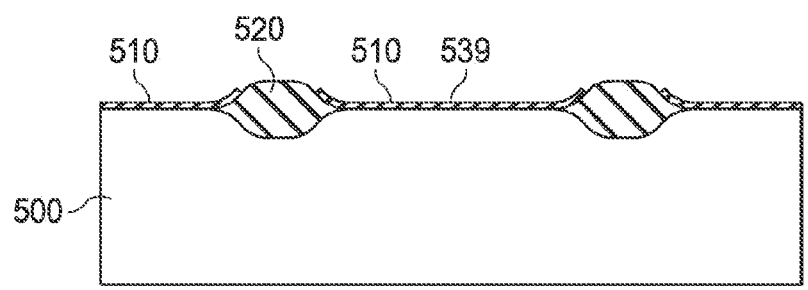

As next illustrated in FIG. 5b, a local isolation is performed to form elongated isolation regions 520. As will be described further below, the elongated isolation regions 520 define the structures for the corrugation lines in the membrane. For example, exposed top surface portions of the first sacrificial layer 500 are oxidized using a thermal oxidation process to form oxide regions 520. The masking layer 510 blocks oxidation of the underlying sacrificial layer 500. Therefore, the oxidation proceeds locally. In one or more embodiments, the masking layer 510 protects other regions (such as other device regions) of the sacrificial layer 500 from being oxidized while forming a thick local oxide in exposed portions of the sacrificial layer 500.

In an alternative embodiment, a smoothing layer may be deposited over the sacrificial layer 500 before forming the masking layer 510. The smoothing layer may be formed as a blanket layer over the sacrificial layer 500 or alternatively, only in the regions of the MEMS device that is being fabricated. The smoothing layer may be a poly silicon layer in one embodiment and may result in smoother corners due to improved stress relaxation during the oxidation process.

Similarly, in an alternative embodiment, the sacrificial layer 500 may be etched using an anisotropic or isotropic etch before exposing to the oxidation process. This may allow tailoring of the lateral profile of the oxide regions 520 formed under the masking layer 510.

Figure 5C:
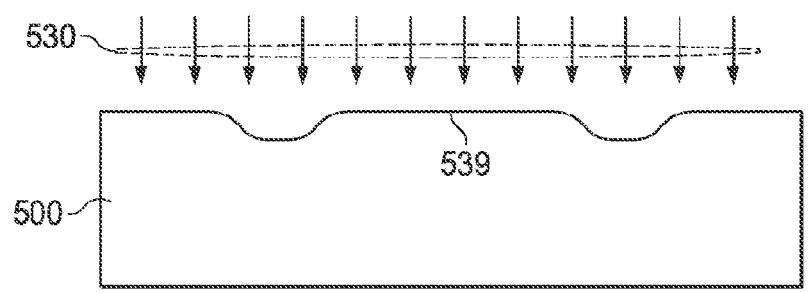

The masking layer 510 is then removed, as illustrated in FIG. 5c. Because of the nature of the oxidation process a portion of the oxide regions 520 protrudes above the top surface of the sacrificial layer 500. Further, the oxide regions 520 have a smooth interface (silicon/oxide boundary) because of the oxidation process. Oxidation, unlike deposition processes, is a diffusion-reaction process involving high temperatures and relatively slower oxidation rates, which results in an interface having no sharp edges between the sacrificial layer 500 and the oxide regions 520. In some embodiments, further smoothing may be performed, for example, by the use of additional anneals such as in a hydrogen atmosphere. The hydrogen anneal may further smooth the oxide regions 520 particularly around the corners and result in a smooth profile as illustrated in FIG. 5c.

Optionally, in one embodiment the isolation material in the elongated isolation regions 520 may be removed. The isolation material in the elongated isolation region 520 may be removed together with the masking layer 510 or may be removed in an individual etch process 530.

Figure 5D:
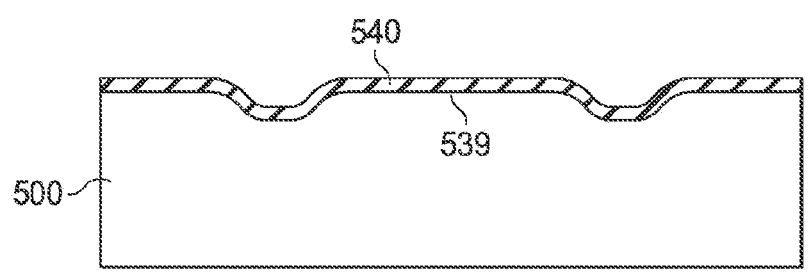

Referring next to FIG. 5d, a second sacrificial layer 540 is deposited over the first sacrificial layer 500. The second sacrificial layer 540 is an oxide, such as silicon oxide, or a nitride such as silicon nitride in one embodiment. Alternatively, the second sacrificial layer 540 is TEOS or silicon oxynitride. The second sacrificial layer 540 may be deposited using a vapor deposition process such as chemical vapor deposition, or plasma vapor deposition in various embodiments.

Figure 5E:
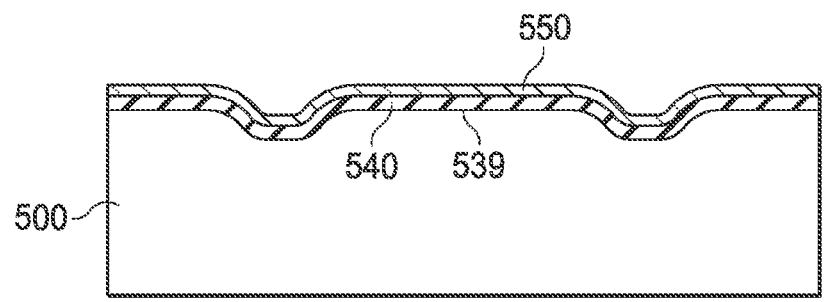
Figure 5F:
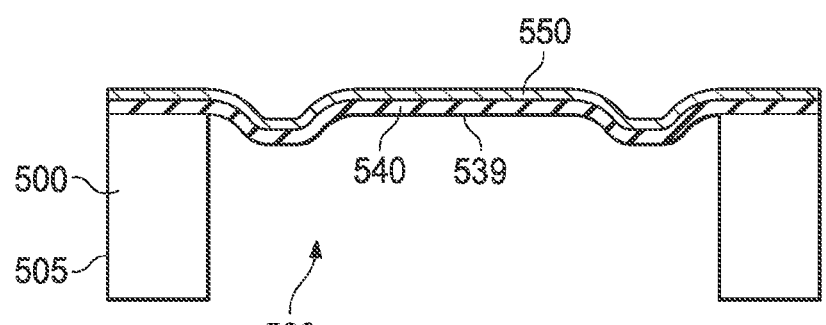

Next, as illustrated in FIG. 5e, a conductive layer may be deposited over the second sacrificial layer 540. The conductive layer may be a polysilicon, a doped polysilicon, or a metal.

In a next step, the first sacrificial layer 500 is partially removed so that a first spacer 505 and an opening 560 are formed. Before the first sacrificial layer 500 is partially removed a protective layer may be formed on the conductive layer 550. The protective layer may comprise silicon nitride or silicon oxide. The partial removal of the first sacrificial layer 500 may be done with a back side etch process. The first sacrificial layer 500 is etched until the second sacrificial layer 540 is exposed.

In an embodiment, the first sacrificial layer 500 may be etched using a Bosch Process, or by depositing a hard mask layer and etching the first sacrificial layer 500 using a vertical reactive ion etch. In one embodiment, only a resist mask is used. If the resist budget is not sufficient, the hard mask and vertical reactive ion etch may be used to achieve a smooth sidewall. However, this integration scheme requires the removal of remaining hard mask residues. Hence, in some embodiments, a Bosch process may be used without additional hard mask.

In the Bosch process, an isotropic plasma etch step and passivation layer deposition step are alternated. The etching/deposition steps are repeated many times during the Bosch process. The plasma etch is configured to etch vertically, e.g., using Sulfur hexafluoride [SF6] in the plasma. The passivation layer is deposited, for example, using octa-fluoro-cyclobutane as a source gas. Each individual step may be turned on for a few seconds or less. The passivation layer protects the sacrificial layer 500 and prevents further etching. However, during the plasma etching phase, the directional ions that bombard the substrate remove the passivation layer at the bottom of the trench (but not along the sides) and etching continues. The Bosch process is stopped when the second sacrificial liner 540 is exposed. The Bosch process may produce sidewalls that are scalloped.

Figure 5G:
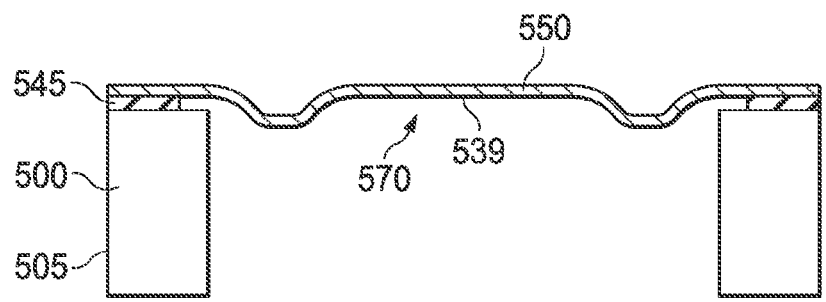

Finally, in FIG. 5g, the second sacrificial layer 540 is partially removed 570 so that a second spacer 545 is formed. FIG. 5g the second sacrificial layer 540 may be removed together with the optional protective layer using, for example, a wet etch chemistry. The wet etch stops after the conductive layer 550 is exposed.

An advantage of this process is that the corrugation lines can be manufactured in the outer region and the inner region of the membrane at the same time. The first sacrificial layer 500 may be patterned with the masking layer 510 so that the inner region of the membrane comprises radial corrugation lines and so that the outer region of the membrane comprises circumferential corrugation lines.

This process may also be used to form a backplate or counter electrode. In this embodiment the radial corrugation lines may be formed over the entire backplate and no circumferential corrugation lines may be formed.

Figure 6A:
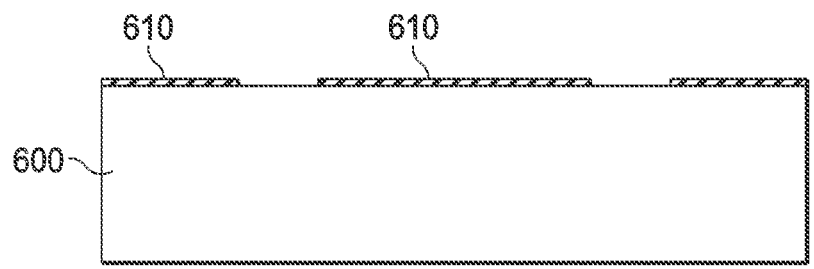
FIG. 6a-6g show an embodiment of a method of manufacturing sharp groove lines in a membrane.

FIG. 6a-6g show an embodiment of making sharp corrugation lines in a membrane or movable electrode. The sharp corrugation lines a formed by etching recesses 620 in a first sacrificial layer 600. The recesses 620 may have any pattern. For example, the recesses may extend radial away from a center point of the membrane to be formed in an inner region. Further, the recesses may be circumferential in an outer region of the membrane. FIG. 6a illustrates a masking layer 610 formed over a first sacrificial layer 600. The materials involved in the process may be similar to the materials used in the embodiment shown in FIGS. 5a-5e. The masking layer 610 may have different etch properties than the first sacrificial layer 600.

Figure 6B:
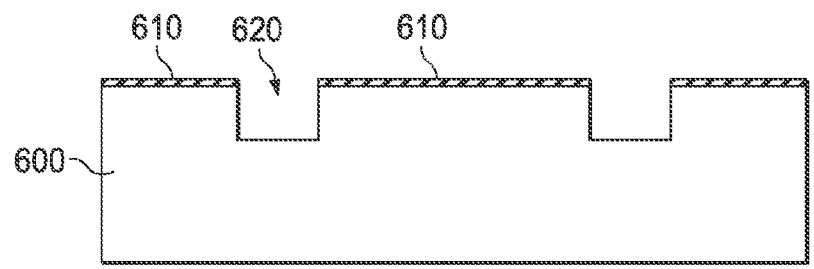

As next illustrated in FIG. 6b, recesses or trenches 620 are etched into the first sacrificial layer 610. The recesses 620 may be structured to define the corrugation lines of the membrane. Alternatively, the areas outside the recesses 620 may be structured to form the corrugation lines. The recesses are etched by applying an anisotropic etch such as a RIE with SF6 gas and continuous polymerisation.

Figure 6C:
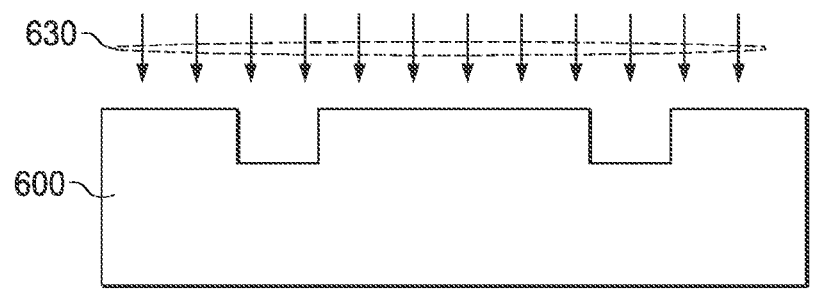
Figure 6D:
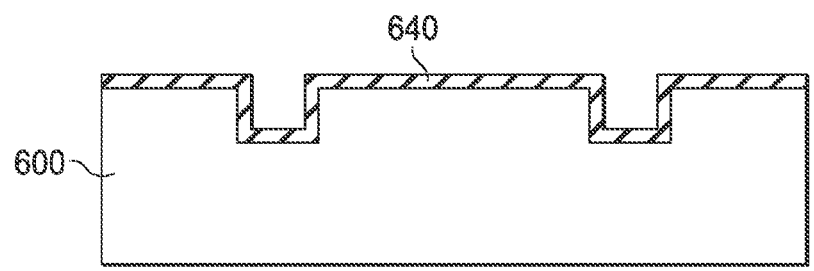
Figure 6E:
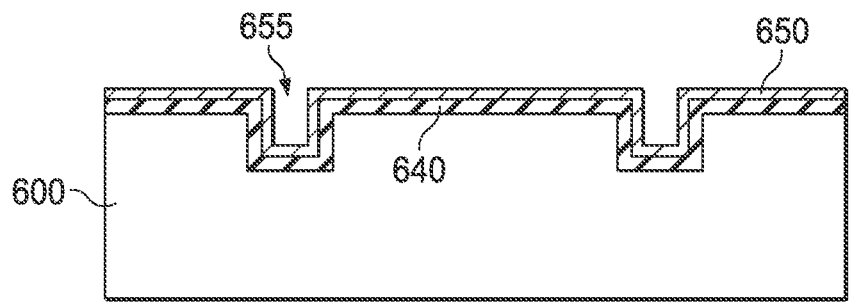
Figure 6F:
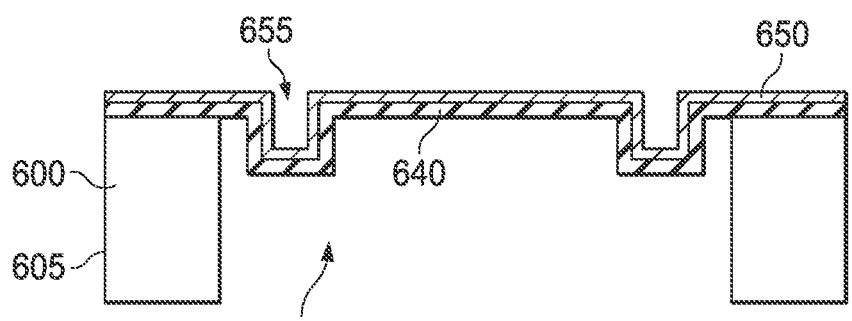
Figure 6G:
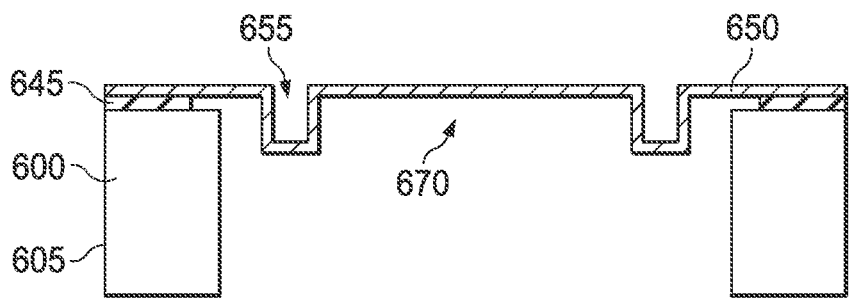

The masking layer 610 is then removed 630, as illustrated in FIG. 6c, and a second sacrificial layer 640 is deposited over the first sacrificial layer 600, as shown in FIG. 6d. The second sacrificial layer 640 overlies the top surface of the first sacrificial layer 600, the sidewalls of the recesses 620 and the bottom surfaces of the recesses 620. Next, as illustrated in FIG. 6e, a conductive layer 650 may be deposited. The conductive layer 650 overlies the top surface of the second sacrificial layer 640 and completely fills the recesses 620.

In a next step, the first sacrificial layer 600 is partially removed so that so that the first spacer 605 and an opening 660 are formed. As discussed with regards to FIG. 5f, the first sacrificial layer 600 is partially removed using a Bosch process. Finally, the second sacrificial layer 640 is partially removed so that the second spacer 645 is formed. The partial removal of the second sacrificial layer 640 exposes the conductive layer or membrane and the corrugation lines 655 therein.

An advantage of this process is that the corrugation lines can be manufactured in the outer region and the inner region of the membrane at the same time. The first sacrificial material 600 may be patterned with the masking layer 610 so that the inner region of the membrane comprises radial corrugation lines and so that the outer region of the membrane comprises circumferential corrugation lines.

This process may also be used to form a backplate or counter electrode. In this embodiment the radial corrugation lines may be formed over the entire backplate and no circumferential corrugation lines may be formed.

Figure 7A:
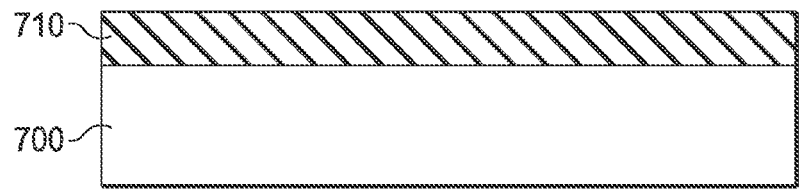
FIG. 7a-7g show an embodiment of a method of manufacturing sharp groove lines in a membrane.
Figure 7B:
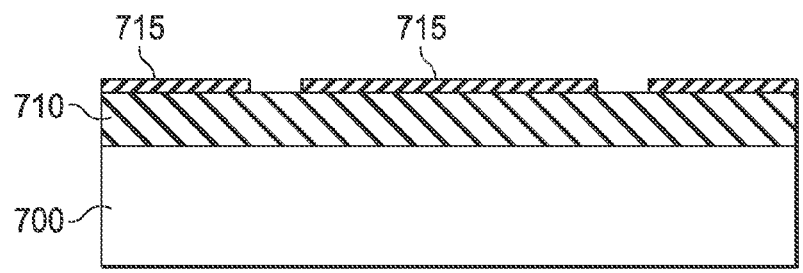

FIG. 7a-7g show another embodiment of making sharp corrugation lines in a membrane or movable electrode 740. The sharp corrugation lines a formed by forming mesas or fins 720 in a first sacrificial layer 710. FIG. 7a illustrates forming a first sacrificial layer 710 over a substrate 700. The first sacrificial layer 710 may be an oxide or a nitride such as silicon oxide or silicon nitride. For example, the first sacrificial layer 710 is TEOS.

The first sacrificial layer 710 is masked 715. The materials involved in the masking process may be similar to the materials used in the embodiment shown in FIGS. 5a-5e. The mask material of the mask layer 715 may comprise a different etch selectivity than the first sacrificial layer 710. The mask 715 is used to form the mesas or fins 720. The mesas 720 may have any pattern. For example, the mesas 720 may extend radial away from a center point of the membrane in an inner region. Further, the mesas 720 may be circumferential in an outer region of the membrane.

Figure 7C:
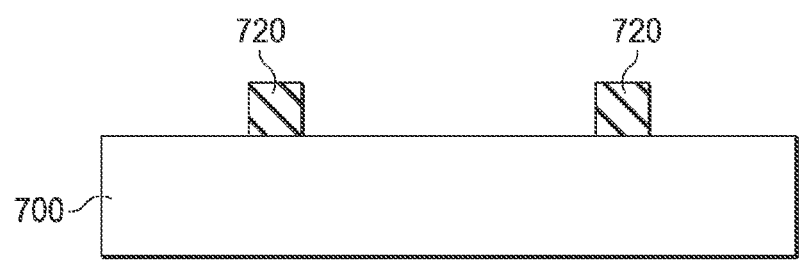

As next illustrated in FIG. 7c, the mesas 720 are etched into the first sacrificial layer 710 almost completely removing the first sacrificial layer 710. The mesas 720 may be structured to define the corrugation lines of the membrane 740. The mesas 720 are formed by applying an anisotropic etch such as a RIE with $SF_6$ gas and continuous polymerisation. The etch stops with when the substrate 700 is exposed.

Figure 7D:
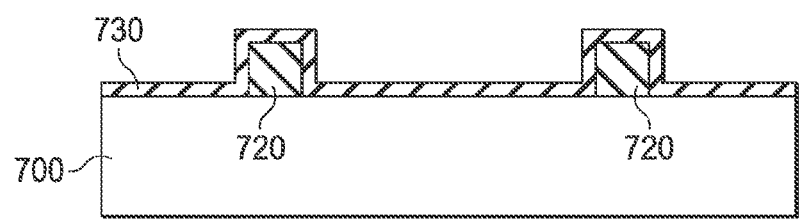
Figure 7E:
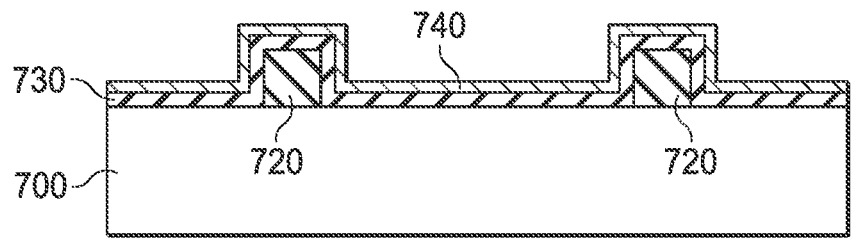
Figure 7F:
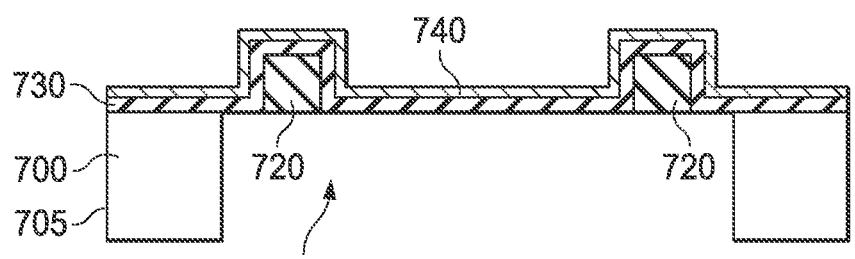
Figure 7G:
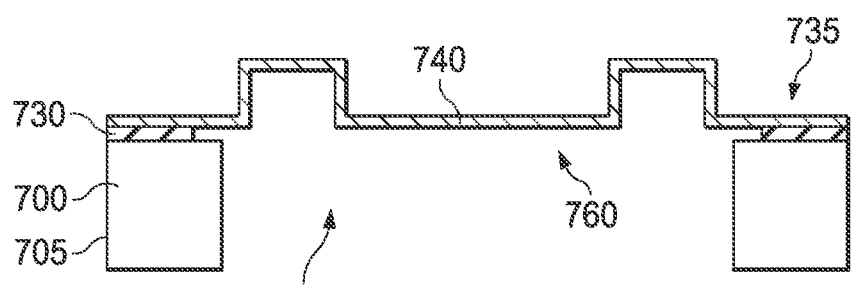

Optionally, the masking layer 715 is then removed over top surface of the mesas 720 and a second sacrificial layer 730 is deposited over the substrate 700 and the mesas 720, as illustrated in FIG. 7*d*. The second sacrificial layer 730 may comprise the same material as the mesas 720. The second sacrificial layer 730 overlies the top surface and the sidewalls of the mesas 720. Next, as illustrated in FIG. 7*e* a conductive layer 740 may be deposited. The conductive layer 740 overlies the top surface of the second sacrificial layer 730 and the mesas 720.

In a next step, the substrate 700 is partially removed so that so that the first spacer 705 and an opening 750 are formed. As discussed with regards to FIG. 5*f*, the substrate 700 is partially removed using a Bosch process. Finally, the second sacrificial layer 730 is partially and the mesas 720 are completely removed so that the second spacer 745 is formed. The partial removal of the second sacrificial layer 730 and the mesas 720 exposes the conductive layer 740 having corrugation lines therein.

An advantage of this process is that the corrugation lines can be manufactured in the outer region and the inner region of the membrane at the same time. The substrate 700 may be patterned with the masking layer 710 so that the inner region of the membrane comprises radial corrugation lines and so that the outer region of the membrane comprises circumferential corrugation lines.

This process may also be used to form a backplate or a counter electrode. In this embodiment the radial corrugation lines may be formed over the entire backplate and no circumferential corrugation lines may be formed.

Figure 8A:
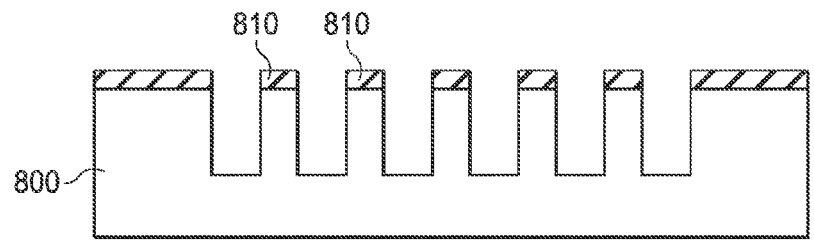
FIGS. 8a-8e shows an embodiment of a method of making ridge lines in the backplate.
Figure 8B:
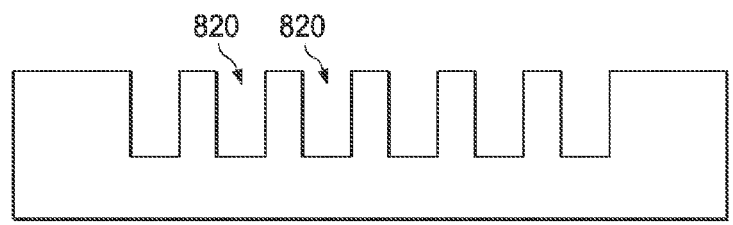

FIGS. 8*a*-8*e* shows a method of making a backplate. FIG. 8*a* illustrates a masking layer 810 formed over a first sacrificial layer 800. The material in FIGS. 8*a*-8*e* may comprise similar materials than the materials described with respect to FIGS. 5*a*-5*g*.

The masking layer 810 is patterned and trenches or recesses 820 are formed in to the first sacrificial layer 800. The recesses 820 are formed using an anisotropic etch process. The trenches 820 may comprise parallel lines, or parallel lines wherein neighboring trenches are connected to each other with at least one connection trench. The connecting trenches may be placed in equidistant distances from each other and may be staggered along a single trench 820. In one embodiment, the trenches 820 may be arranged in a cross-shape configuration, in a polygonal configuration such as a hexagonal configuration or a honeycomb configuration. In yet another embodiment the trenches 820 may be arranged radial leading away from a central point. The radial trenches 820 may or may not be connected via connecting trenches. The trenches 820 may be arranged in a star like configuration.

Figure 8C:
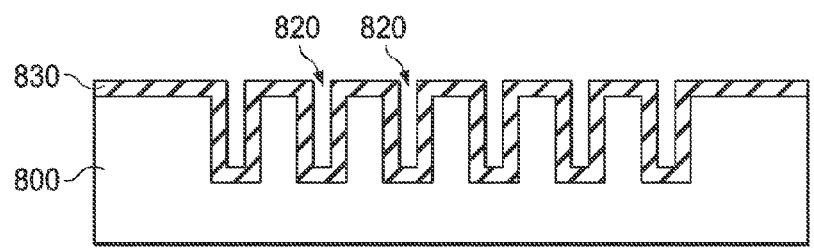

After removing the masking layer 810, the trenches 820 are partially filled with a second sacrificial layer 830 as shown in FIG. 8*c*. The second sacrificial layer 830 may overlie the first sacrificial layer 800 and the trenches 820 conformal. The second sacrificial layer 830 may be an insulating material, a conductive material or a material with an etch selectivity relative to the first sacrificial layer and the conductive layer 840 deposited on the second sacrificial layer 830.

Figure 8D:
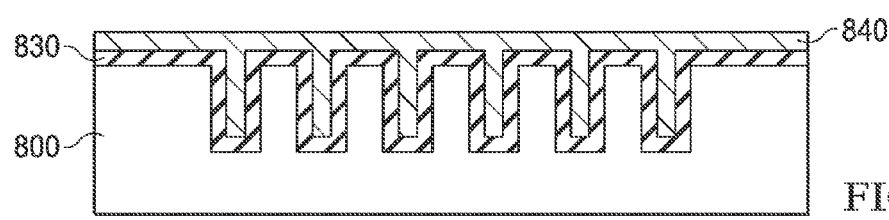

In a next step, shown in FIG. 8*d*, a conductive material is deposited over the second sacrificial layer 830. The partially filled trenches 820 are completely filled with a conductive material layer 840. The conductive material layer 850 may be a metal, a polysilicon, a doped polysilicon or combinations thereof. The conductive material layer 840 is formed in the trenches and over a top surface of the substrate 800.

Figure 8E:
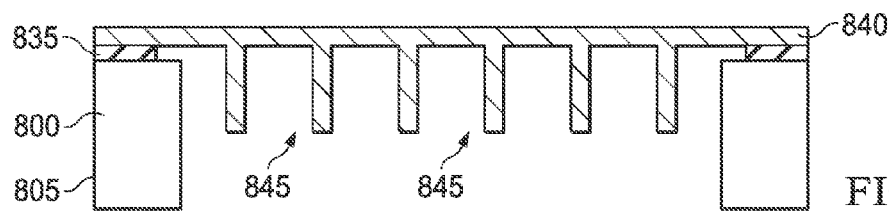

Finally, the first sacrificial layer 800 and the second sacrificial layer 830 are partially removed to expose the fin lines, corrugation lines or ridge lines 845 formed by the trench pattern 820. The first sacrificial layer 800 and the second sacrificial layer 830 are removed by an appropriate etching process, so that a cavity 850 is formed as shown in FIG. 8*e*. The first sacrificial layer 800 and the second sacrificial layer 830 may be removed with a single etch process or with two different etch processes. The first sacrificial layer 800 and the second sacrificial layer 830 are removed such that a portion of the first sacrificial layer 800 forms a first spacer 805 and that a portion of the second sacrificial layer forms a second spacer 835.

The resulting structure may comprise a backplate or a counter electrode having fin lines, corrugation lines, or ridge lines 845. The backplate may comprise parallel lines, or parallel lines connected together with connection lines. The connecting lines for a single line 845 may be staggered and may be placed in equidistant distances. In one embodiment, the lines 845 of the backplate may comprise a cross-shape configuration, a polygonal configuration such as a hexagonal configuration or a honeycomb configuration. In yet another embodiment the lines 845 of the backplate have a star like configuration leading away from a central point of the backplate. As a result, the lines may comprise any geometrical configuration that stabilizes the backplate.

Figure 9:
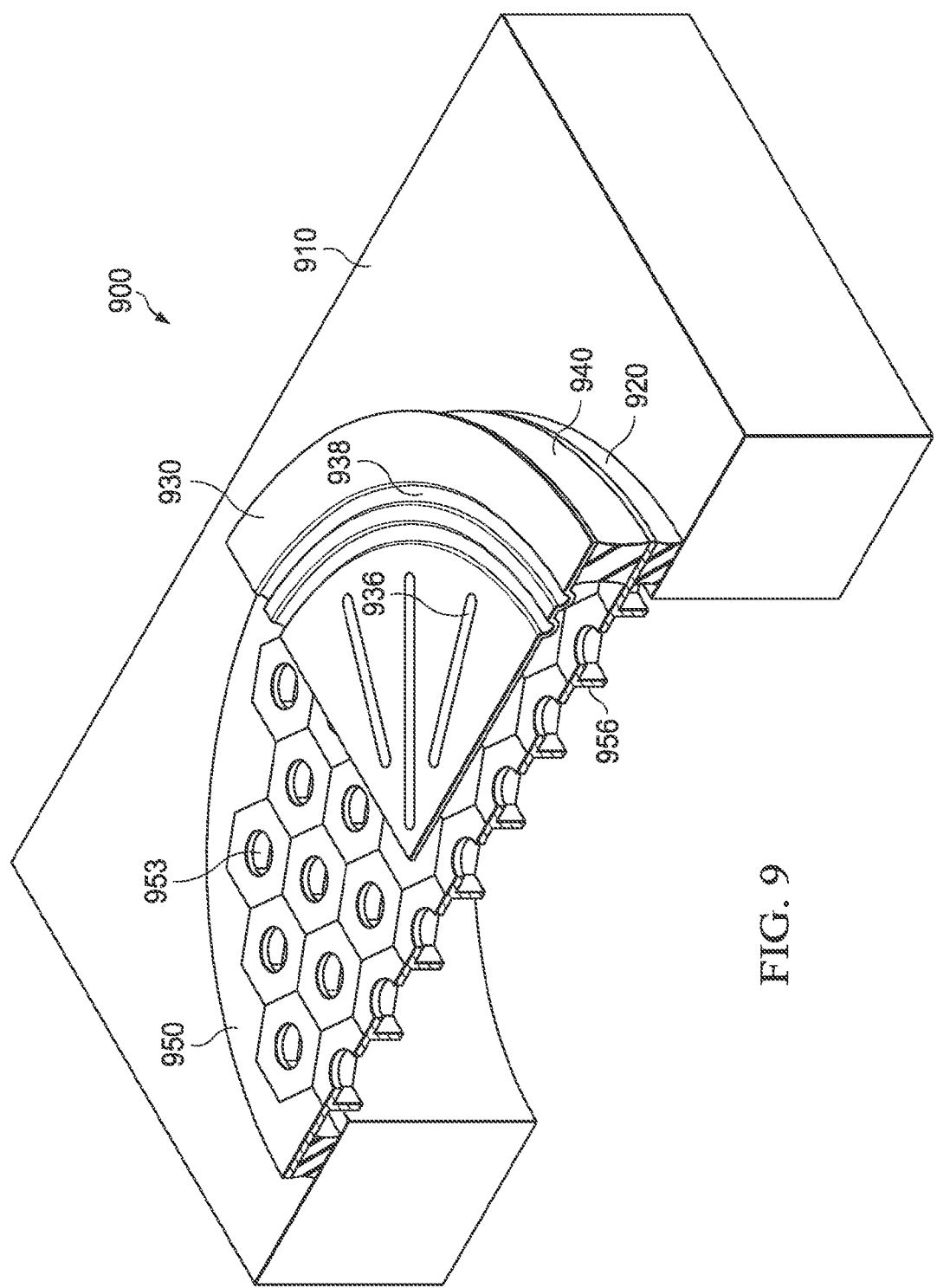
FIG. 9 shows a perspective view of an embodiment of a MEMS structure.

FIG. 9 shows a perspective view of an embodiment of a MEMS device 900. FIG. 9 shows only ¼ of the MEMS device 900. In this particular arrangement the membrane 930 is disposed above the backplate 950. The membrane 930 is spaced apart from the substrate 910 by a first isolation spacer 920 and the backplate 950 is spaced apart from the membrane 930 by a second isolation spacer 940. In this embodiment the corrugation lines 936 in the inner region of the membrane 930 increase the stiffness of the membrane 930 and the corrugation lines 938 in an outer region of the membrane 930 increase the flexibility of the membrane 930. The corrugation lines 936, 938 may face toward the backplate 950 or may face away from the backplate 950. The corrugation lines 936, 938 may be formed according to the embodiments shown in FIGS. 5-7.

The honey comb configuration of fins or ridges 956 in the backplate 950 increases the stiffness of the backplate 950. As shown in FIG. 9 the backplate 950 is perforated and comprises ridges 956. The honey comp structure is arranged around the perforation holes 953 so that each honey comp surrounds one perforation hole 953. Alternatively, the honey comp structure may have a different configuration, e.g., surrounding two or more than two perforation holes. The ridges 956 may be formed according to the embodiment of FIG. 8. The MEMS device 900 may comprise the same materials as described with respect to FIG. 2.

Figure 10A:
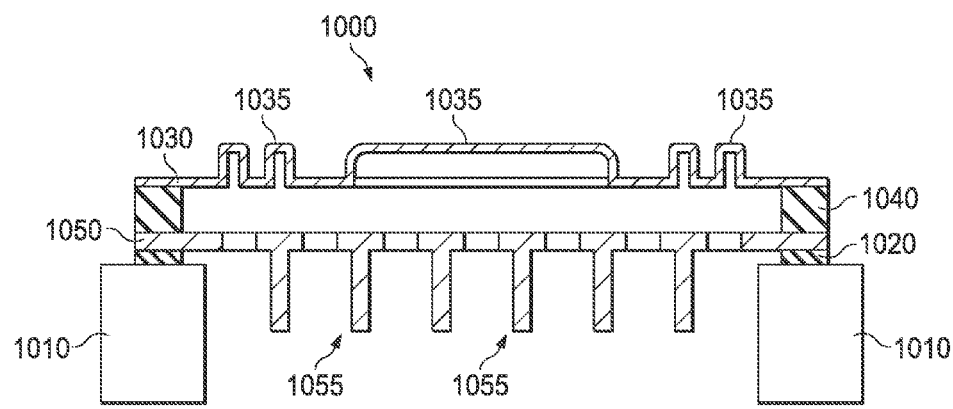
FIGS. 10a-10f shows cross-sectional views of embodiments of MEMS structure having a backplate with ridges.

FIGS. 10*a*-10*d* show different embodiments of MEMS devices 1000. FIG. 10*a* shows a cross sectional view of a similar embodiment as the embodiment shown in FIG. 9. In this embodiment the membrane 1030 is arranged above the backplate 1050. The membrane 1030 is spaced apart from the backplate 1050 by a second spacer 1040 and the backplate 1050 is spaced apart from the substrate 1010 by a first spacer 1020. The backplate 1050 comprises ridge lines 1055 such as fin lines or corrugation lines and the membrane 1030 comprises corrugation lines 1035 facing away from the backplate 1050. Alternatively, the corrugation lines 1035 of the membrane 1030 face toward the backplate 1050. The membrane 1030 comprises corrugation lines 1035 in the inner region and the outer region. Alternatively, the membrane 1030 comprises corrugation lines 1035 only in the inner region but not in the outer region. The backplate 1050 may comprise any of the ridge pattern described with respect to FIG. 2.

Figure 10B:
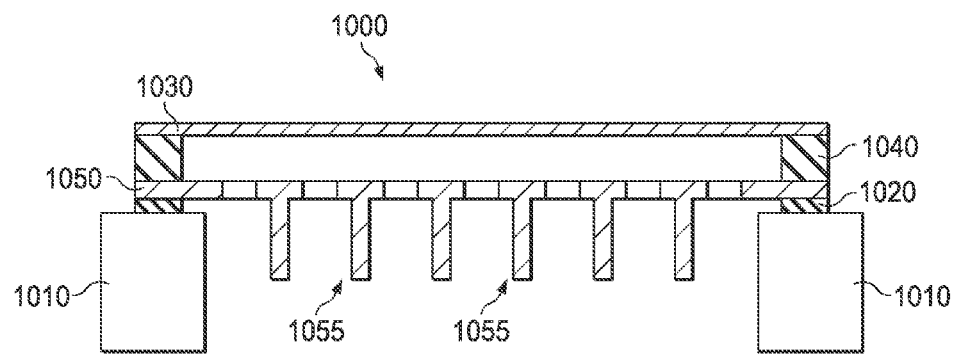

FIG. 10b shows a cross sectional view of an embodiment where the membrane 1030 is arranged above the backplate 1050 and the membrane 1030 does not comprise any corrugation lines 1035.

In an embodiment the backplate 1050 may comprise a plurality of first backplate electrodes. For example, the first backplate 1050 comprises a first backplate electrode which corresponds to the inner region of the membrane and a second backplate electrode which corresponds to the outer region of the membrane as discussed with respect to FIG. 4c. The first and second backplate electrodes may be isolated from each other. In one example, the ridge lines extend over the entire first backplate 1050. In one embodiment the second backplate is a single backplate electrode. Alternatively, the second backplate electrode comprises a plurality of second backplate electrodes. The second backplate electrode may comprise a similar ridge line configuration as the first backplate electrodes or a different corrugation configuration.

Figure 10C:
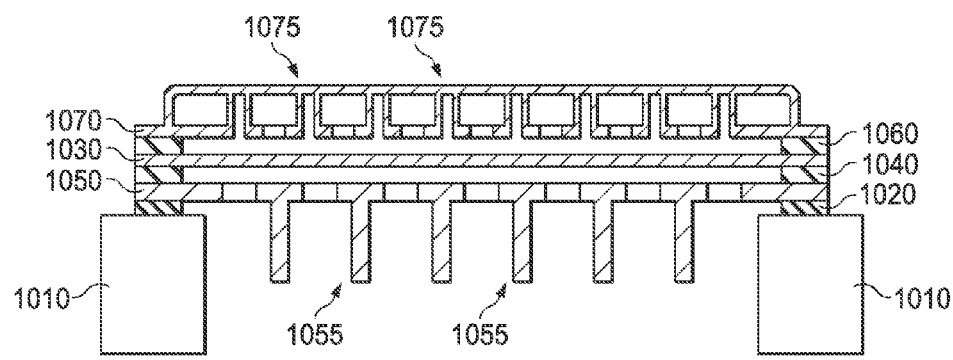
Figure 10D:
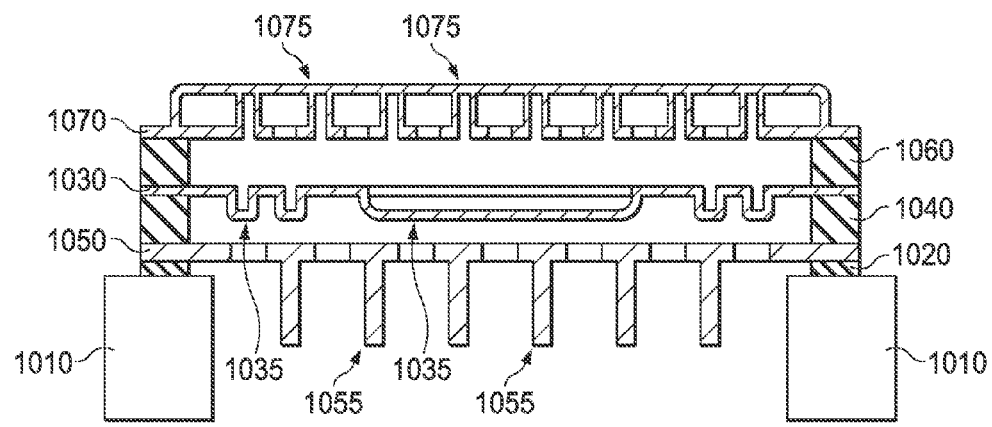

FIG. 10c shows a cross sectional view of an embodiment having two backplates, 1050, 1070. The membrane 1030 is arranged between the first backplate 1050 and the second backplate 1070. The second backplate 1070 is spaced apart from the membrane 1030 by a third spacer 1060. Each of the two backplates 1050, 1070 comprise ridge lines or corrugation lines 1055, 1075. The ridge line or corrugation line configuration 1055, 1075 may be the same for the first and second backplates 1050, 1070. Alternatively, the ridge line or corrugation line configuration 1055, 1075 for the first and second backplates 1050, 1060 may be different. For example, the ridge line configuration 1055 of the first backplate 1050 may be a honeycomb configuration and the ridge line or corrugation line configuration 1075 of the second backplate 1070 may be a star like configuration. The membrane 1030 in between the two backplates 1050, 1060 is corrugation line free. FIG. 10d shows an alternative embodiment where the membrane 1030 comprises corrugation lines 1035. The membrane 1035 may comprise corrugation lines 1035 in the inner region but not in the outer region or may comprise corrugation lines in the inner region and in the outer region. For example, the membrane 1030 may comprise radial corrugation lines 1035 in the inner region and the circumferential 1035 corrugation lines in the outer region.

In an embodiment the first backplate 1050 may comprise a plurality of first backplate electrodes. For example, the first backplate 1050 comprises a first backplate electrode which is aligned to the inner region of the membrane 1030 and a second backplate electrode which is aligned to the outer region of the membrane 1030. The first and second backplate electrodes may be isolated from each other. The ridge lines or corrugation lines of the first backplate 1050 may extend over the entire backplate 1050. In one embodiment the second backplate 1070 is a single backplate electrode. Alternatively, the second backplate 1070 comprises a plurality of second backplate electrodes. The second backplate 1070 may comprise a similar ridge line or corrugation line configuration as the first backplate 1050 or a different ridge line or corrugation configuration.

Figure 10E:
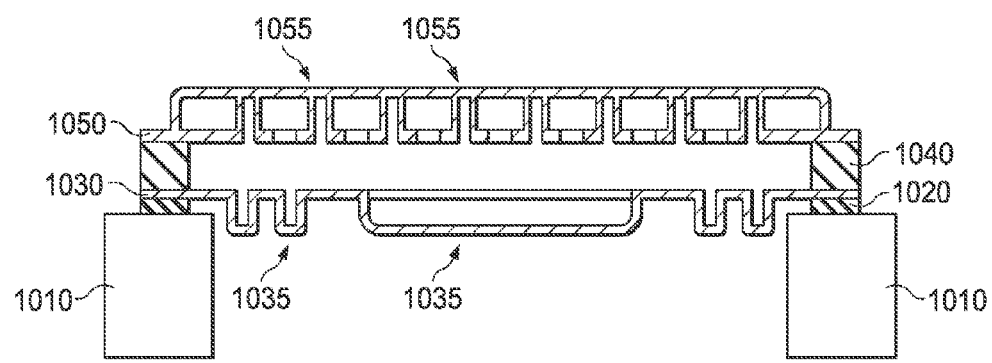

FIG. 10e shows a cross sectional view of a backplate 1050 arranged above the membrane 1050. The backplate 1050 is spaced apart from the membrane 1030 by a second spacer 1040 and the membrane 1030 is spaced apart from the substrate 1010 by a first spacer 1020. The backplate 1050 comprises ridge lines and the membrane 1030 comprises corrugation lines facing away from the backplate 1050. Alternatively, the corrugation lines of the membrane 1030 face toward the backplate 1050. The membrane 1030 comprises corrugation lines in the inner region and the outer region. Alternatively, the membrane 1030 comprises corrugation lines only in the inner region but not in the outer region. The backplate 1050 may comprise any of the ridge line configuration described previously herein. For example, the backplate 1050 may comprise a star like configuration.

Figure 10F:
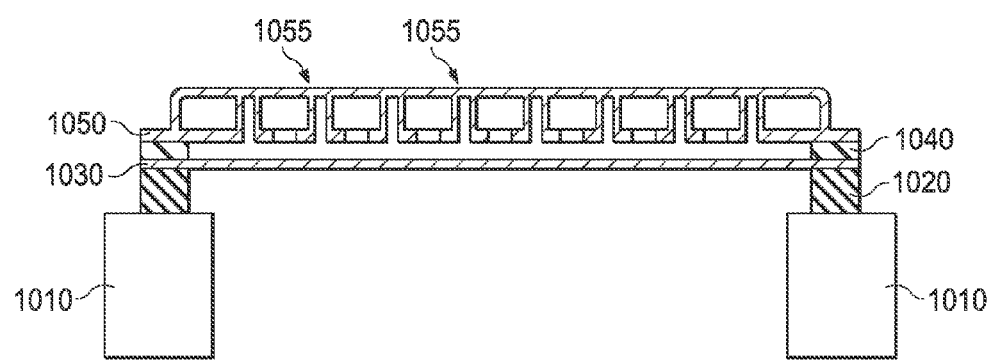

FIG. 10f shows a cross sectional view of an embodiment where the backplate 1050 is arranged above the membrane 1030 and the membrane 1030 does not comprise any corrugation lines. The embodiments of the MEMS devices in FIGS. 10e and 10f may comprise a plurality of membrane electrodes and/or a plurality of backplate electrodes.

Figure 11A:
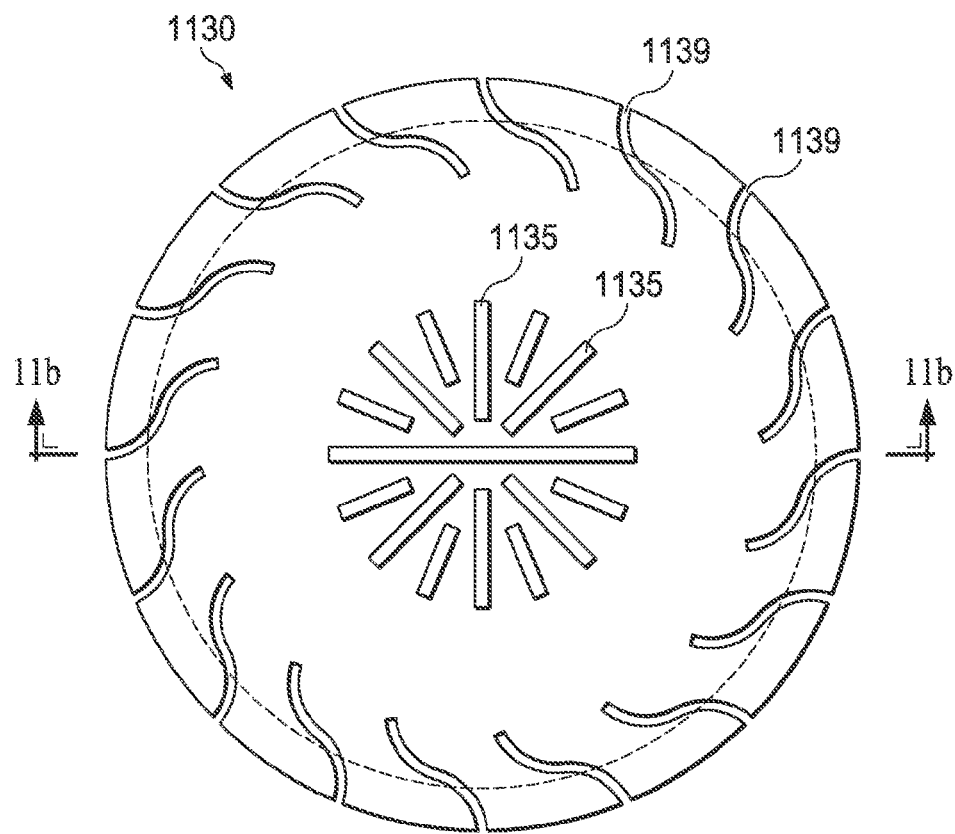
FIG. 11a-11b shows a top view and a cross-sectional view of a further embodiment of a membrane.
Figure 11B:
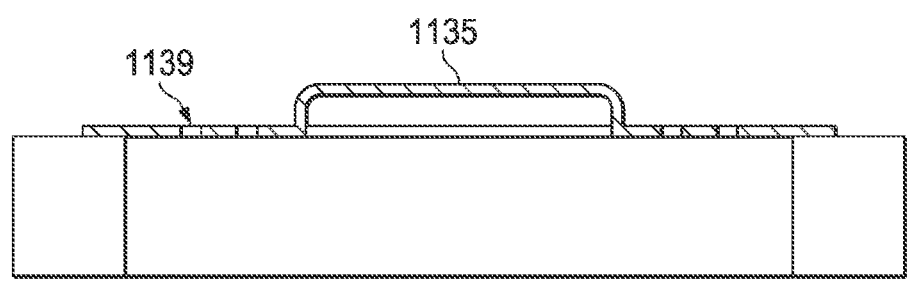

FIGS. 11a and 11b show a further embodiment of a membrane 1130. The membrane 1130 comprises radial corrugation lines 1135 in an inner region as can be seen in FIG. 11a.

In this embodiment the membrane 1130 may comprise lateral spring supports 1139 in an outer region of the membrane 1130. The spring support 1139 may be slots or apertures in the outer rim of the membrane 1139. The apertures or slots 1139 may comprise a meander design or a curved design such as a quarter of a circular line. Alternatively, the apertures or slots 1139 may comprise any design. In one embodiment, the apertures or slots 1139 contribute to a low frequency cut off of the transfer characteristics of the MEMS device and therefore should be small. For example, the cumulated area of the slots 1139 should be less than 5% of the membrane 1130 area or should be less than 2% of the membrane area. FIG. 11b shows cross sectional view of them membrane 1130 along the line C-C showing the a corrugation line 1135 and the spring support 1139.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate;
    a moveable electrode comprising a corrugation line, the corrugation line configured to stiffen an inner region of the moveable electrode; and
    a first counter electrode, wherein the moveable electrode and the first counter electrode are mechanically connected to the substrate.

2. The semiconductor device according to claim 1, wherein the corrugation line comprises a plurality of radial corrugation lines.

3. The semiconductor device according to claim 2, wherein the moveable electrode further comprises a circumferential corrugation line.

4. The semiconductor device according to claim 3, wherein the radial corrugation lines are located in an inner region of the moveable electrode, and wherein the circumferential corrugation line is located in an outer region of the moveable electrode.

5. The semiconductor device according to claim 1, wherein the moveable electrode and the first counter electrode comprise a plurality of electrodes.

6. The semiconductor device according to claim 1, further comprising a second counter electrode, the second counter electrode arranged such that the moveable electrode is located between the first counter electrode and the second counter electrode.

7. The semiconductor device according to claim 6, wherein the first counter electrode comprises first corrugation lines, and wherein the second counter electrode comprises second corrugation lines.

8. A MEMS structure comprising:
   a substrate;
   a moveable electrode comprising radial corrugation lines in an inner region and circular corrugation lines in an outer region; and
   a first perforated counter electrode comprising first ridges, wherein the moveable electrode and the first perforated counter electrode are mechanically connected to the substrate.

9. The MEMS structure according to claim 8, wherein moveable electrode is arranged below the first perforated counter electrode closer to the substrate.

10. The MEMS structure according to claim 8, wherein the first perforated counter electrode is arranged below the moveable electrode closer to the substrate.

11. The MEMS structure according to claim 8, further comprising a second perforated counter electrode comprising second ridges, and wherein the moveable electrode is arranged between the first perforated counter electrode and the second perforated counter electrode.

12. The MEMS structure according to claim 8, wherein the first perforated counter electrode comprises a first counter electrode and a second counter electrode, wherein the first counter electrode is in register with the inner region of the moveable electrode, and wherein the second counter electrode is in register with the outer region of the moveable electrode.

13. The MEMS structure according to claim 12, wherein the moveable electrode comprises a first moveable electrode and a second moveable electrode, wherein the inner region comprise the first moveable electrode, and wherein the outer region comprises the second moveable electrode.

14. The MEMS structure according to claim 8, wherein moveable electrode comprises a radius, wherein an inner area of the inner region is defined by about 80% of the radius, and wherein an outer area of the outer region is defined by about 20% of the radius.

15. A method of making an electrode of a MEMS device, the method comprising:
   forming trenches in a first sacrificial layer, each trench has substantially the same depth;
   forming a second sacrificial layer lining a top surface of the first sacrificial layer, sidewalls and a bottom surface of the trenches;
   forming a conductive material layer over a top surface of the second sacrificial layer and filling the trenches;
   removing a first portion of the first sacrificial layer forming a first spacer; and
   removing a second portion of the second sacrificial layer forming a second spacer thereby exposing the conductive material layer.

16. The method according to claim 15, wherein forming the conductive material layer comprises forming fin lines, and wherein two parallel fin lines are connected via a connecting fin line.

17. The method according to claim 15, wherein forming the conductive material layer comprises forming fin lines, and wherein the fin lines form a honeycomb configuration.

18. A method of making an electrode of a MEMS device, the method comprising:
   forming a first sacrificial layer over a substrate;
   forming mesas in the first sacrificial layer;
   forming a second sacrificial layer over the mesas;
   forming a conductive layer over the second sacrificial layer and the mesas;
   removing a first portion of the substrate forming a first spacer;
   removing a second portion of the second sacrificial layer forming a second spacer; and
   removing the mesas.

19. The method according to claim 18, wherein the mesas are radial mesas leading away from a central point of the substrate.

20. The method according to claim 19, further comprising circumferential mesas, wherein the radial mesas are supported by an inner region of the substrate, and wherein the circumferential mesas are supported by an outer region of the substrate.

* * * * *